United States Patent
Derkits, Jr. et al.

(10) Patent No.: US 6,835,984 B2
(45) Date of Patent: Dec. 28, 2004

(54) ESD RESISTANT DEVICE

(75) Inventors: Gustav Edward Derkits, Jr., New Providence, NJ (US); Leslie Marchut, Maplewood, NJ (US); Franklin R. Nash, Princeton, NJ (US)

(73) Assignee: Agere Systems Inc., Allentown, PA (US)

( * ) Notice: Subject to any disclaimer, the term of this patent is extended or adjusted under 35 U.S.C. 154(b) by 76 days.

(21) Appl. No.: 10/215,442

(22) Filed: Aug. 9, 2002

(65) Prior Publication Data

US 2002/0195263 A1 Dec. 26, 2002

Related U.S. Application Data

(62) Division of application No. 09/583,699, filed on May 31, 2000, now Pat. No. 6,489,232.

(51) Int. Cl.[7] .............................................. H01L 23/62
(52) U.S. Cl. ...................................... 257/355; 257/484
(58) Field of Search .................................. 257/355, 484

(56) References Cited

U.S. PATENT DOCUMENTS

| | | | |
|---|---|---|---|
| 4,821,089 A | | 4/1989 | Strauss |
| 5,019,002 A | * | 5/1991 | Holmberg .................... 445/24 |
| 6,121,080 A | | 9/2000 | Wu |

FOREIGN PATENT DOCUMENTS

| EP | 0 938 131 A2 | 8/1999 |
|---|---|---|
| EP | 1 018 698 A2 | 7/2000 |

OTHER PUBLICATIONS

H. Neitzert and A. Piccirillo, "Sensitivity of multimode bidirectional optoelectronic modules to electrostatic discharges," Microelectronics Reliability 39(1999): 1863–1871.

T. Diep, S. Phatak, D. Yoo, "PIN Photodetectors—the ESD bottleneck in Laser Packages," Proc. EOS/ESD Symposium '92 (1992): 159.

S. Voldman, "The State of the Art of Electrostatic Discharge Protection: Physics, Technology, Circuits, Design, Simulation and Scaling," IEEE Journal of Solid–State Circuits 34 (1999): 1272–1282.

European Search Report dated May. 26, 2004.

Inglis et al., "SA 17. 7: A Robust, 1.8V 250 uW Direct–Contact 600 dpi Fingerprint Sensor" IEEE International Solid State Circuits Conference, IEEE Inc. New York, US 1998, pp. 284–285.

\* cited by examiner

*Primary Examiner*—Fetsum Abraham

(57) ABSTRACT

A semiconductor device such as a photodetector has a substrate having an active region layer containing an active region of the device. A dielectric layer is disposed on the active region layer, and a metal active region contact is disposed in the dielectric layer above the active region and electrically contacting the active region. A metal electrostatic discharge (ESD)protection structure is disposed in the dielectric layer around the active region contact, wherein the ESD protection structure electrically contacts the active region layer of the substrate to provide an ESD discharge path for charge on the surface of the dielectric layer.

22 Claims, 1 Drawing Sheet

ESD RESISTANT DEVICE

CROSS REFERENCE TO RELATED APPLICATIONS

This application is a divisional application of U.S. patent application Ser. No. 09/583,699, entitled "ESD Resistant Device", filed on May 31, 2000 by Derkits et al., now U.S. Pat. No. 6,489,232.

BACKGROUND OF THE INVENTION

1. Field of the Invention

The present invention relates to electrostatic discharge (ESD) protection, and, more particularly, for a fabricated device such as a photodetector having increased resistance to ESD.

2. Description of the Related Art

A wide variety of devices are fabricated using semiconductor substrates. These devices include integrated circuits (ICs) and other fabricated semiconductor devices such as photodetectors. Photodetectors include APD (avalanche photodiode) and PIN photodetectors, which convert light received into a signal current. The acronym PIN (pin) stands for Ptype-Intrinsic type-Ntype, i.e. the initials of the three layers that make up the classic diode. A PIN diode is a pn junction with a doping profile tailored in such a way that an intrinsic layer, "i region," is sandwiched in between a p layer and an n layer. InP-based PIN photodetectors, for example, are widely used as a component in optical communication systems.

Such semiconductor devices are vulnerable to damage from electrostatic discharge (ESD). ESD damage to the device active region of a photodetector can result from discharge of charge stored on the device surface for example.

Referring now to FIG. 1, there is shown a cross-sectional view of a portion of a conventional device 100 with surface charge Q that may result in ESD damage to device 100. Device 100 is, for example, an APD or PIN photodetector, fabricated as a chip from a wafer substrate such as InP. Photodetector 100 has N contacts 107 and P contact 101 for applying a bias voltage and for receiving a current signal proportional to the light incident on the bottom layer, between N contacts 107, via a lens (not shown). Substrate layer 104 is an n-type InP material layer. Dielectric layer 103 is, for example, a fully-passivating nitride layer. Layer 106 is an n-type region, composed, for example, of InGaAs, and other layers (not shown). Device 100 has a chip thickness H. The active region 10 of device 100 contains P metal contact 101, and the general active region beneath P contact 101, including P-type diffused junction region 105. P contact 101 is an epitaxially grown cap layer, composed of p-contact metal. Junction 105 is a circular diffused P-type junction within N-type layer 106, and to which the metal of P contact 101 is applied. The term "dot" is sometimes employed to refer to these devices, since the junction is typically less than 100 μm in diameter and the chip is typically more than 500 μm across. The area of the junction, roughly equivalent to the area of the P contact 101, is sometimes referred to as the "pdot". P contact 101 is sometimes referred to as the detector dot contact.

In both PIN and APD discrete devices the active region 110 of the device 100 typically comprises a small fraction of the semiconductor used to create the device. Surface charge Q, which is proportional to the area of the chip, can discharge through the P contact 101 and thus through the device active area 110, i.e. into P contact 101, and through diffused junction 105 and surrounding layers 106, thus damaging the device. ESD can damage the device, for example, at the region of highest electric field, at the junction of the absorption region (of layer 106) with the P region of diffused junction 105. In an APD, this is the multiplication region and is closely adjacent to the heterojunction.

ESD due to discharge of surface charge on the side of the device containing the device active region can therefore cause premature failure of devices such as communication photodetectors, thus posing a significant reliability threat to the operation and manufacture of such devices. Photodetectors used in laser package and other lightwave subassemblies, for example, can be very susceptible to ESD damage. This is because PIN and APD photodetectors which are used for signal applications are characterized by having very small junction areas (to get low capacitance for high speed) surrounded by relatively large chips (for handling and bonding). This leads to a high current density through the device active region, when there is an ESD caused by discharge of surface charge on the active region surface of the device. Further discussion of ESD and its effect on devices such as photodetectors may be found in H. Neitzert and A. Piccirillo, "Sensitivity of multimode bidirectional optoelectronic modules to electrostatic discharges," *Microelectronics Reliability* 39(1999): 18631871; T. Diep, S. Phatak, D. Yoo, "PIN Photodetectors—the ESD bottleneck in Laser Packages," *Proc. EOS/ESD Symposium* 92 (1992): 159; S. Voldman, "The State of the Art of Electrostatic Discharge Protection: Physics, Technology, Circuits, Design, Simulation and Scaling," *IEEE Journal of Solid-State Circuits* 34 (1999): 12721282.

One approach to minimizing ESD damage from discharge of surface charge is to enlarge the area of the device active region to minimize the current density of the discharge. However, this increases the capacitance of the device, thereby decreasing bandwidth performance.

SUMMARY

A semiconductor device such as a photodetector has a substrate having an active region layer containing an active region of the device. A dielectric layer is disposed on the active region layer, and a metal active region contact is disposed in the dielectric layer above the active region and electrically contacting the active region. A metal electrostatic discharge (ESD) protection structure is disposed in the dielectric layer around the active region contact, wherein the ESD protection structure electrically contacts the active region layer of the substrate to provide an ESD discharge path for charge on the surface of the dielectric layer.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

In the present invention, a metal ring is placed on the device surface around the active region of the device. The ring is in ohmic contact with the top semiconductor surface, which isolates the active region from the majority of the device surface charge.

Figure 2:
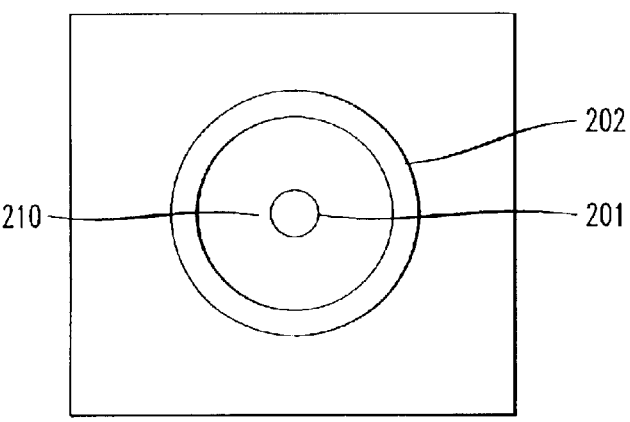
FIG. 2 shows a top view of an improved device, having a metal ring structure for reducing ESD damage, in accordance with an embodiment of the present invention.
Figure 3:
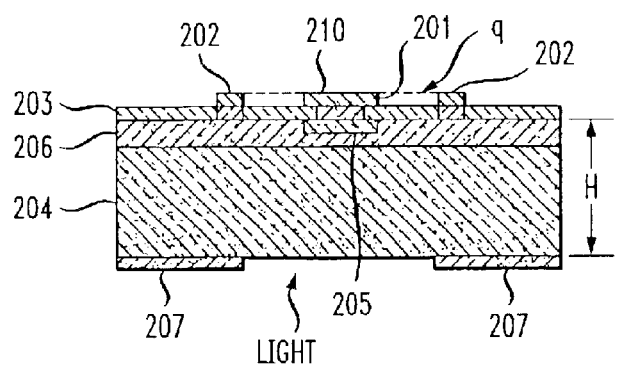
FIG. 3 is a cross-sectional view of the device of FIG. 2.

Referring now to FIG. 2, there is shown a top view of an improved device 200, having a metal ring structure 202 (ESD protection or grounding ring) for reducing ESD damage, in accordance with an embodiment of the present invention. Device 200 is, for example, an APD or PIN photodetector, fabricated as a chip from a wafer substrate such as InP. Referring also to FIG. 3, there is further shown a cross-sectional view of device 200. Photodetector 200 has N contacts 207 and P contact 201 for applying a bias voltage and for receiving a current signal proportional to the light incident on the bottom layer, between N contacts 207, via a lens (not shown). Substrate layer 204 is an n-type InP material layer. Dielectric layer 203 is, for example, a fully-passivating nitride layer. Layer 206 is an n-type region, composed, for example, of InGaAs, and other layers (not shown). Device 200 has a chip or substrate thickness H.

The active region 210 of device 200 contains P metal contact 201 (e.g. AuBe), and the general active region beneath P contact 201, including P-type diffused junction region 205. P contact 201 is an epitaxially grown cap layer, composed of P-contact metal. Junction 205 is a circular diffused P-type junction within N-type layer 206, and to which the metal of P contact 201 is applied. The diameter of the P contact 201 and thus of the active region is very small in relation to the overall area of the device. For example, the diameter of P contact 201 may be approximately 100 μm or less.

The photodetector portion of device 200 is thus similar to that of device 100. However, the ESD protection ring 202 leads to a greatly reduced surface charge q which can discharge through active region 210, because the area outside ring 202 is isolated from the active region 210 of photodetector 200 by ESD protection ring 202. That is, charge outside ring 202 primarily discharges through ring 202, into layer 206, away from the active region of the device, in a high-voltage ESD event. Charge q inside ring 202 may discharge partly through P contact 201 and thus through the device active region, and partly through ring 202. However, the total amount of charge q is far less than the charge Q on the entire device surface, thus reducing the discharge current density through the device active region during an ESD event. The present invention thus reduces the effective area of discharge from the area A of the whole chip to a small fraction (A') of that area, i.e. the area A' inside ring 202<<area A, so that q<<Q. By reducing the effective area capable of storing charge, the susceptibility to discharge across the device upper surface is reduced.

The radius of ring 202 is selected empirically depending upon the application and tradeoffs made by the designer. The larger ring 202 is, the smaller is the improvement in ESD protection. The smaller ring 202 is, the more protection from ESD damage caused by surface charge. However, practical considerations may limit how small ring 202 is. For example, it should not be so close to the active region that discharge through ring 202 damages the active region.

In an embodiment, ring 202 preferably has a radius less than or equal the thickness H of the chip 200. The width of the ring 202 structure itself is preferably about 10 μm or more. Thus, in an embodiment, the thickness H is approximately 100125 μm, the diameter of P contact 201 and the active region is about 100 μm, the surface of the chip containing the fabricated device is about 500 μm or more in width and length (square), and the ring 202 has a width of 10 μm, and is substantially centered on P contact 201 with a diameter of about twice the thickness H.

Figure 1:
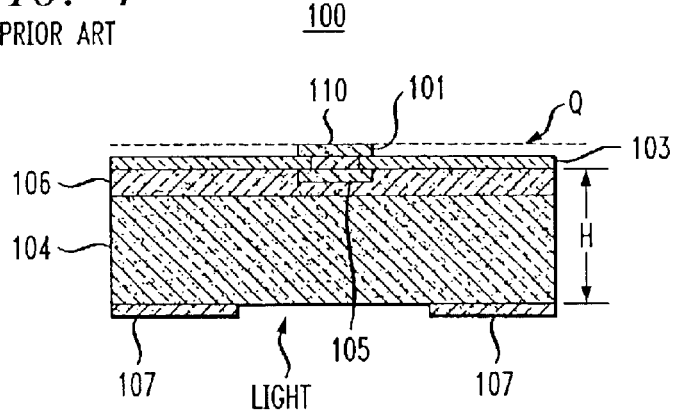
FIG. 1 is a cross-sectional view of a conventional device with surface charge that may result in ESD damage to the device.

To fabricate ring 202, the mask used to create the hole in dielectric layer 203 for the P contact 201 is modified to include a ring with the same contrast as the hole. Thus, at the process step in which the dielectric nitride layer 203 is opened for the p-contact 201 to the active region 210, the nitride is also opened for the ring. The mask used to deposit the P-type metallization of P contact 201 is also modified to include a ring with the same contrast as used to deposit this metallization. Thus, at the process step in which metal is deposited to create the P-ohmic contact 201 to the P+ layer 205, the same metal is also deposited in the ring opening created previously in dielectric layer 203. In an embodiment, as illustrated in the cross-sectional view of FIG. 3, the ring 202 contact metallization defined by the pohmic contact process laps onto the surface of dielectric layer 203 in order to make good contact to the top of the dielectric surface and to avoid open semiconductor at the metal/dielectric junction. Although the contact metal used for the P+ contact will make a poor ohmic contact to the N-type material of layer 206, it is nevertheless adequate for high voltage isolation. An advantage of this process is that it is manufacturable using the same process sequence used to fabricate a conventional device such as device 100 of FIG. 1. Moreover, ESD damage is minimized, without increasing device capacitance $C_j$, and without increasing leakage current $I_d$. In addition, ring 202 may further help secure dielectric layer 203 to layer 206 and prevent delamination. It may also help to decrease corrosion.

Device 200 may be a photodetector such as a PIN or APD photodetector. As noted above, one reason PIN and APD photodetectors can benefit from the ESD protection of the shorted ring of the present invention is that such devices typically have very small junction areas (to get low capacitance for high speed) and are surrounded by relatively large chips (for handling and bonding), thus leading to increased susceptibility to ESD damage. Most discrete devices for nonsignal (e.g. power) or slow (e.g. acoustic signal) applications are much larger and have higher capacitance and higher ESD robustness. However, other devices may benefit from increased ESD robustness by employing an ESD protection ring. For example, a discrete high speed signal transistor, especially one made of a compound semiconductor such as GaAs or AlGaAs, with a dielectric coating on the surface, may benefit from the presence of an ESD protection ring as described herein. The present invention may also be employed to protect other junction devices with similar architecture to that of PIN or APD photodetectors, that are prone to ESD damage from surface charge.

In the embodiment described above, ring 202 is essentially circular, closed, and centered around the device active region. In alternative embodiments, other shapes may be employed for the ESD protection structure, such as ovals or rectangles, although a circular shape is preferred. In addition, although a closed (continuous) ESD protection ring is preferred, in alternative embodiments the ring may have gaps, or may be composed of a plurality of discrete metal portions (i.e., the ring appears as a dotted or dashed ring). In general, the present invention provides for an ESD protection structure around the device active region, for providing a discharge path for surface charge to discharge from the surface into the top layer of the chip (beneath the dielectric coating), with which the ESD protection structure is in electrical contact. The ESD protection structure of the present invention thus serves to decrease the surface charge that can discharge through the active region contact by isolating the active region contact from a great majority of the surface charge, by providing an alternative discharge path for surface charge. It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A semiconductor device, comprising:
   (a) a substrate having an active region substrate layer containing an active region of the device;
   (b) a dielectric layer disposed on the active region substrate layer;
   (c) a metal active region contact disposed in the dielectric layer over the active region and electrically contacting the active region; and
   (d) a metal electrostatic discharge (ESD) protection structure disposed in the dielectric layer around the active region contact, wherein the ESD protection structure electrically contacts the active region substrate layer to provide an ESD discharge path for charge on the surface of the dielectric layer.

2. The device of claim 1, wherein the ESD protection structure isolates the active region from the majority of the device surface charge.

3. The device of claim 1, wherein the ESD protection structure is an essentially circular, closed ESD protection ring substantially centered around the active region contact.

4. The device of claim 3, wherein the ESD protection ring isolates the active region from the majority of the device surface charge outside the ESD protection ring.

5. The device of claim 1, wherein the active region contact is composed of an ohmic metal and the ESD protection structure is composed of the same metal.

6. The device of claim 1, wherein the device is a photodetector.

7. The device of claim 6, wherein the photodetector is one of an APD and a PIN photodetector.

8. The device of claim 7, wherein: the ESD protection structure is an essentially circular, closed ESD protection ring substantially centered around the active region contact;
   the substrate has a substrate thickness; and
   the radius of the ESD protection ring is about equal to the substrate thickness.

9. The device of claim 8, wherein:
   the active region contact is circular having a radius of about 100 $\mu$m;
   the substrate thickness is in the range of about 100 to 125 $\mu$m;
   the radius of the ESD protection ring is in the range of about 100 to 125 $\mu$m; and
   the width of the ESD protection ring is about 10 $\mu$m.

10. The device of claim 1, wherein the active region comprises a diffused junction region in the active region substrate layer.

11. The device of claim 10, wherein:
    the device is one of an APD and a PIN photodetector;
    the active region layer is an n-type layer;
    the diffused junction region is a p-type diffused junction region; and
    the active region contact and the ESD protection structure are composed of p-type ohmic contact metal.

12. The device of claim 1, wherein the active region contact and the ESD protection structure are fabricated during the same fabrication step during which ohmic contact metal suitable for use as the active region contact is deposited.

13. The device of claim 1, wherein the ESD protection structure electrically contacts the active region substrate layer to provide a direct ESD discharge path for charge on the surface of the dielectric layer.

14. The device of claim 13, wherein the ESD protection structure isolates the active region from the majority of the device surface charge.

15. The device of claim 13, wherein the ESD protection structure is an essentially circular, closed ESD protection ring substantially centered around the active region contact.

16. The device of claim 13, wherein the ESD protection ring isolates the active region from the majority of the device surface charge outside the ESD protection ring.

17. The device of claim 13, wherein the active region contact is composed of an ohmic metal and the ESD protection structure is composed of the same metal.

18. The device of claim 13, wherein the device is a photodetector.

19. The device of claim 18, wherein the photodetector is one of an APD and a PIN photodetector.

20. The device of claim 19, wherein: the ESD protection structure is an essentially circular, closed ESD protection ring substantially centered around the active region contact;
    the substrate has a substrate thickness; and
    the radius of the ESD protection ring is about equal to the substrate thickness.

21. The device of claim 13, wherein the active region comprises a diffused junction region in the active substrate layer.

22. The device of claim 21, wherein:
    the device is one of an APD and a PIN photodetector;
    the active region layer is an n-type layer;
    the diffused junction region is a p-type diffused junction region; and
    the active region contact and the ESD protection structure are composed of p-type ohmic contact metal.

* * * * *